(12) United States Patent
Wallrafen et al.

(10) Patent No.: US 10,483,828 B2
(45) Date of Patent: Nov. 19, 2019

(54) ELECTRIC MOTOR HAVING SMD COMPONENTS AND ASSOCIATED CONNECTION COMPONENT

(71) Applicant: Continental Automotive GmbH, Hannover (DE)

(72) Inventors: Werner Wallrafen, Hattersheim (DE); Daniel Muresan, Giroc (RO)

(73) Assignee: Continental Automotive GmbH, Hannover (DE)

(*) Notice: Subject to any disclaimer, the term of this patent is extended or adjusted under 35 U.S.C. 154(b) by 169 days.

(21) Appl. No.: 15/506,008

(22) PCT Filed: Sep. 3, 2015

(86) PCT No.: PCT/EP2015/070188
§ 371 (c)(1),
(2) Date: Feb. 23, 2017

(87) PCT Pub. No.: WO2016/037927
PCT Pub. Date: Mar. 17, 2016

(65) Prior Publication Data
US 2017/0271959 A1    Sep. 21, 2017

(30) Foreign Application Priority Data
Sep. 8, 2014  (DE) .......................... 10 2014 217 933

(51) Int. Cl.
*H02K 11/00* (2016.01)
*H02K 13/14* (2006.01)
(Continued)

(52) U.S. Cl.
CPC ........... *H02K 11/0094* (2013.01); *H02K 5/14* (2013.01); *H02K 5/225* (2013.01); *H02K 11/40* (2016.01);
(Continued)

(58) Field of Classification Search
CPC ........ H02K 23/00; H02K 23/04; H02K 23/66; H02K 11/0094; H02K 11/40; H02K 5/14;
(Continued)

(56) References Cited

U.S. PATENT DOCUMENTS 3,528,050 A    9/1970  Hindenburg
4,617,609 A *  10/1986  Utner ...................... H01G 2/06
                                                    29/25.42
(Continued)

FOREIGN PATENT DOCUMENTS

CN    1338142    2/2002
CN    101888740  11/2010
(Continued)

OTHER PUBLICATIONS

Office Action dated Mar. 6, 2019 issued in Korean Patent Application No. 10-2017-7006406.

*Primary Examiner* — Burton S Mullins
(74) *Attorney, Agent, or Firm* — Cozen O'Connor

(57) ABSTRACT

An electric motor includes a plurality of SMD components arranged on a carrier of the motor, and a connection part for the SMD components together with an electrically conductive housing part of the motor. A contact spring electrically connects a plurality of SMD components to the housing part. The contact spring has a main section, a spring-type connection section that extends outwards from one side of the main section, and at least one spring-type contact section that extends outwards from the other side of the main section. The spring-type connection section of the contact spring includes a plurality of contact fingers for the SMD components.

10 Claims, 2 Drawing Sheets

(51) Int. Cl.
    *H01R 39/38*     (2006.01)
    *H01R 4/64*     (2006.01)
    *H05K 1/02*     (2006.01)
    *H02K 11/40*     (2016.01)
    *H02K 5/14*     (2006.01)
    *H02K 5/22*     (2006.01)
    *H05K 1/03*     (2006.01)
    *H05K 1/18*     (2006.01)

(52) U.S. Cl.
    CPC ......... *H05K 1/0215* (2013.01); *H05K 1/0313* (2013.01); *H05K 1/183* (2013.01); *H05K 1/0284* (2013.01); *H05K 1/181* (2013.01); *H05K 2201/0311* (2013.01)

(58) Field of Classification Search
    CPC .... H04R 4/4809; H01R 12/58; H01R 13/112; H01R 13/115; H05K 2201/0311
    USPC ......................................................... 439/816
    See application file for complete search history.

(56) References Cited

U.S. PATENT DOCUMENTS

| | | | | |
|---|---|---|---|---|
| 5,010,264 | A * | 4/1991 | Yamada | D01G 15/36 |
| | | | | 310/68 C |
| 5,087,497 | A * | 2/1992 | Suzuki | H02K 23/66 |
| | | | | 156/196 |
| 5,140,205 | A * | 8/1992 | Baines | H02K 23/66 |
| | | | | 310/239 |
| 5,218,254 | A * | 6/1993 | Someya | H02K 5/225 |
| | | | | 310/71 |
| 5,250,751 | A | 10/1993 | Yamaguchi | |
| 5,281,876 | A * | 1/1994 | Sato | H02K 11/026 |
| | | | | 310/40 MM |
| 5,572,077 | A * | 11/1996 | Kimura | H02K 5/145 |
| | | | | 310/40 MM |
| 6,051,781 | A | 4/2000 | Bianca et al. | |
| 6,528,915 | B1 | 3/2003 | Moskob | |
| 6,768,243 | B1 | 7/2004 | Yamazaki et al. | |
| 6,858,955 | B2 * | 2/2005 | Lau | H01R 39/24 |
| | | | | 310/239 |
| 9,564,789 | B2 | 2/2017 | Wallrafen | |
| 2002/0030414 | A1 | 3/2002 | Mizutani et al. | |
| 2005/0200230 | A1 | 9/2005 | Breynaert et al. | |
| 2014/0001897 | A1 | 1/2014 | Wallrafen | |
| 2014/0227915 | A1 | 8/2014 | Glick et al. | |

FOREIGN PATENT DOCUMENTS

| | | |
|---|---|---|
| CN | 10409312 | 8/2014 |
| DE | 198 58 627 A1 | 6/2000 |
| DE | 10 2005 007 611 A1 | 10/2005 |
| DE | 10 2004 037 912 A1 | 4/2006 |
| DE | 10 2006 026 477 A1 | 12/2007 |
| DE | 10 2012 006 499 A1 | 10/2013 |
| JP | 60-192680 | 10/1985 |
| JP | 04-121384 | 4/1992 |
| JP | 11-154800 | 6/1999 |
| JP | 2001-008414 | 1/2001 |
| JP | 2014-510406 | 4/2014 |
| KR | 200461907 Y1 | 8/2012 |
| WO | WO 01/39354 | 5/2001 |
| WO | WO 2012/120032 | 3/2012 |

* cited by examiner

ELECTRIC MOTOR HAVING SMD COMPONENTS AND ASSOCIATED CONNECTION COMPONENT

CROSS-REFERENCE TO RELATED APPLICATIONS

This a U.S. national stage of application No. PCT/EP2015/070188, filed on 3 Sep. 2015, which claims priority to the German Application No. 10 2014 217 933.5 filed 8 Sep. 2014, the content of both incorporated herein by reference.

BACKGROUND OF THE INVENTION

1. Field of the Invention

The present invention relates to an electric motor having a plurality of SMD components (SMD: surface mounted device).

SMD components, as compared to leaded electronic components, are distinguished by their compact size and simple mounting. As is standard, SMD components are mounted on printed circuit boards or ceramic substrates and are soldered to printed conductor tracks of the printed circuit boards. The printed conductor tracks must then be connected to further electrical connectors, in particular via connection cables or wires. The present invention relates to the mounting of such SMD components onto a support of an electric motor.

DE 10 2012 006 499 A1 describes an electric motor in which the connection part provided is used for connecting a printed circuit board to a housing part of the electric motor, wherein the connection part engages on the printed circuit board via a single clamping leg.

U.S. Pat. No. 6,768,243 B1 describes an electric motor having a connection part that connects a capacitor to the housing wall of the electric motor. In this case, the connection part comprises two clamping legs, which are provided, solely for reasons of symmetry, for simplifying assembly, since only a single capacitor should therefore be connected to ground.

Further connection parts of this type, which are used either for connecting printed circuit boards or for connecting individual components, are described in DE 10 2004 037 912 A1, DE 198 58 627 A1, and DE 10 2006 026 477 A1.

SUMMARY OF THE INVENTION

An object of the invention is to address the problem of providing an electric motor of the type described above, but in which the connection of the SMD components to a housing part of the electric motor is particularly simply designed.

According to an aspect of the invention, a simple and practical solution is provided for electrically connecting a suitable plurality of SMD components to a housing part of the electric motor. A contact spring is used for this purpose, which contact spring has a corresponding plurality or contact fingers, each of which is in contact with an SMD device. These contact fingers extend from a main section of the contact spring, from the other side of which at least one contact section extends. The at least one contact section is used for the electrical connection of the contact spring to the electrically conductive housing part. The contact spring preferably consists of resilient material, such as steel, whereby lead frame material, which is thinned on the end, is avoided. The contact spring can, for example, be plated with tin, nickel, silver, or other materials, in order to provide corrosion protection.

According to an aspect of the invention, a single, easily manufactured component is therefore utilized for electrically connecting a plurality of SMD components to the housing part.

The housing part can be, for example, the housing outer wall of the electric motor. The support can be a brush holder of the electric motor.

The single contact spring, which is provided according to the invention, is connected via the contact fingers to one side of the SMD components. In this case, the SMD components are electrically conductively fixed to the contact fingers, in particular by clamping and/or soldering or conductive adhesion.

The SMD components can be embedded in an insulating material or can be coated therewith, in order to provide a suitable moisture barrier.

Preferably, the contact spring is made of electrically conductive material, and the SMD components are grounded by being connected to the electrically conductive housing part.

This housing part is, for example, a part of a metallic motor housing.

As mentioned above, in one aspect, the contact spring is clamped onto the support of the electric motor. In addition thereto, the middle section of the contact spring can comprise at least one fixing clamp on the side of the contact finger for the SMD components and/or on the aide of the at least one contact section for the housing part. This results in an additional fixation of the contact spring on the support. These fixing clamps can be, for example, inward projecting sections, for example, of the main section of the contact spring, which dig into the support when the contact spring is placed on the support and, in this way, ensure an additional fixation.

In yet another preferred embodiment, an insulating protective wall is situated between adjacent SMD components in order to avoid short circuits.

The SMD components are placed in recesses or chambers of the support. The contact fingers of the contact spring thereby engage into the individual chambers and, there, come into contact with the SMD components situated in the chambers.

According to the invention, a contact spring preferably consisting of steel is therefore utilized, which connects a plurality of SMD components or all SMD components of the electric motor to a housing part of the motor. For this purpose, the contact spring comprises a plurality of contact fingers for a plurality of SMD components or for all SMD components. At least one contact section for establishing an electrical contact to an electrically conductive housing part, preferably the metallic housing outer wall of the motor, is provided on the opposite side of the spring.

The present invention, according to a further aspect, relates to a connection part for connecting a plurality of SMD components situated on a support of an electric motor to an electrically conductive housing part of the motor. This connection part is configured as a contact spring that has a main section, a plurality of resilient contact fingers extending from one side of the main section, and at least one resilient contact section extending from the other side of the main section.

The contact spring preferably has a U-shaped main section, from one leg of which the contact fingers extend, and from the other leg of which the at least one contact section extends.

The contact spring is clamped, for example, onto a support of an electric motor, by the U-shaped main section. The plurality of contact fingers can then come into contact with a plurality of SMD components, which are situated on the support of the engine. The resilient contact section extending from the other side of the main section is used for establishing an electrical connection to the housing part.

The middle section of the contact spring comprises at least one fixing clamp, preferably on both legs thereof, which can be an inwardly bent section of the spring, which digs into the support, for example, when the contact spring is placed on the support, and thereby ensures an additional fixation of the spring.

BRIEF DESCRIPTION OF THE DRAWINGS

The invention is explained in detail in the following with reference to exemplary embodiments in combination with the drawing. In the drawings.

DETAILED DESCRIPTION OF THE PRESENTLY PREFERRED EMBODIMENTS

Figure 1:
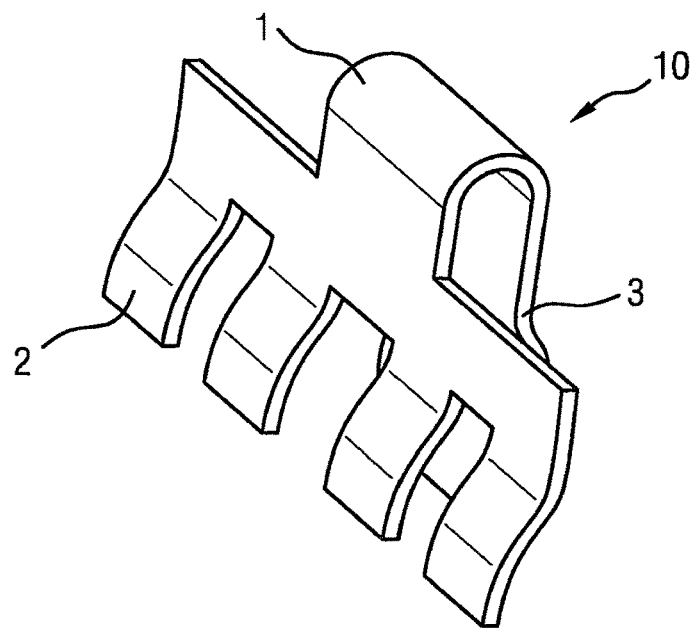
FIG. 1 shows a three-dimensional view of a first embodiment of a contact spring.
Figure 2:
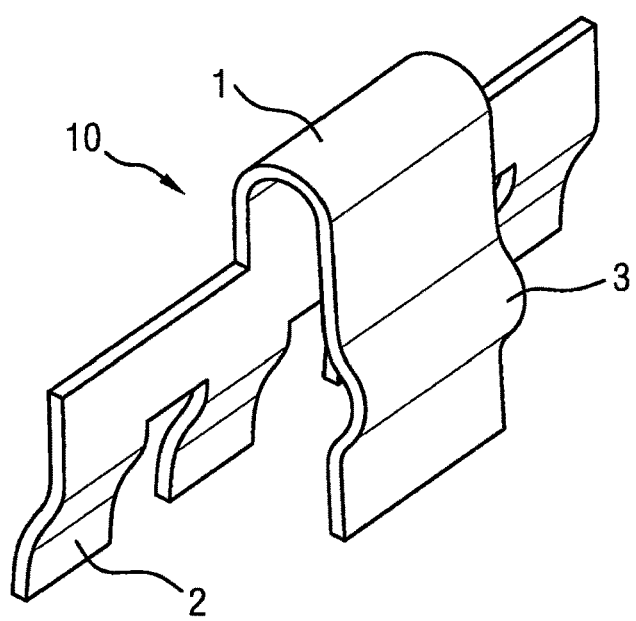
FIG. 2 shows a three-dimensional view of the contact spring from FIG. 1, as viewed from the opposite side.

The contact spring 10 shown in FIGS. 1 and 2 is used for connecting four SMD components to an electrically conductive housing part of an electric motor. The contact spring consists of resilient material, namely thin steel sheet in this case, and has a U-shaped main section 1, which has the shape of an inverted U. Four contact fingers 2 extend from one leg of the U-shaped main section 1, namely the front leg in FIG. 1, and, proceeding from the main section, are curved in the forward direction and come into contact with one SMD component each after the installation of the contact spring. A resilient contact section 3 extends from the leg on the back side in FIG. 1. The U-shaped main section 1 is placed on a support 6 (see FIG. 4) of the electric motor and is clamped thereon, wherein the rear, resilient contact section 3 secures the contact to the electrically conductive housing wall 8 (housing part (see FIG. 4)), and the front, curved, resilient contact fingers 2 establish the contact to the SMD components.

In the embodiment shown, the front leg of the U-shaped main section expands on both sides, in order to transition into the four contact fingers 2.

Figure 3:
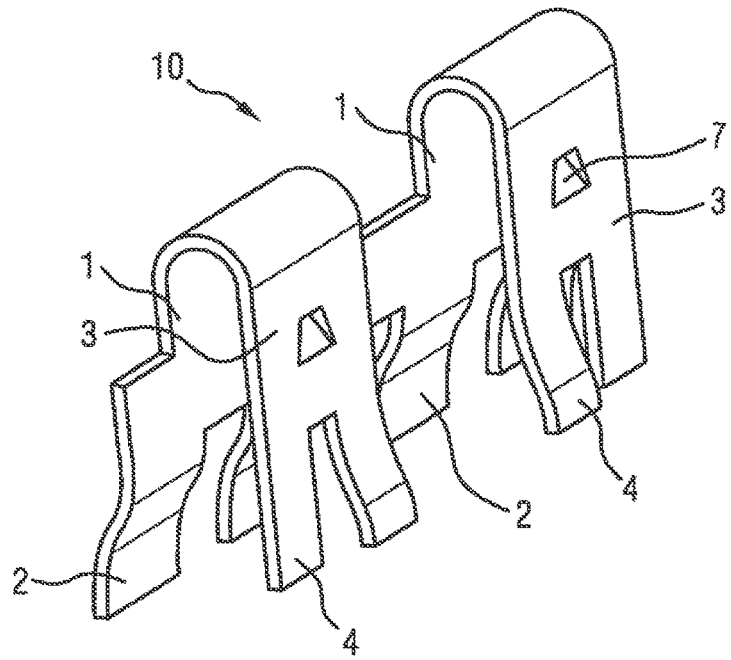
FIG. 3 shows a three-dimensional view of another embodiment of a contact spring.

FIG. 3 shows another embodiment of a contact spring 10. In this embodiment, the main section 1 is subdivided into two U-shaped subsections, which likewise have the shape of an inverted U. The two rear legs of the U-shaped main section 1 each likewise transition into a downward extending, resilient contact section 3 which, in this embodiment, has two divided, finger-shaped sections 4. The two front legs of the U-shaped main section 1 expand and transition into four contact fingers 2, which are curved in the forward direction and establish the contact to four SMD components 5. In this case as well, the main section 1 is placed, via its two lower sections, on a support 6 of an electric motor and is fixedly clamped there.

The two rear legs of the U-shaped main section 1 are each provided with a fixing clamp 7 which is an inward projecting section which, when the contact spring is placed on the support 6, digs into the support and affixes the spring.

Figure 4:
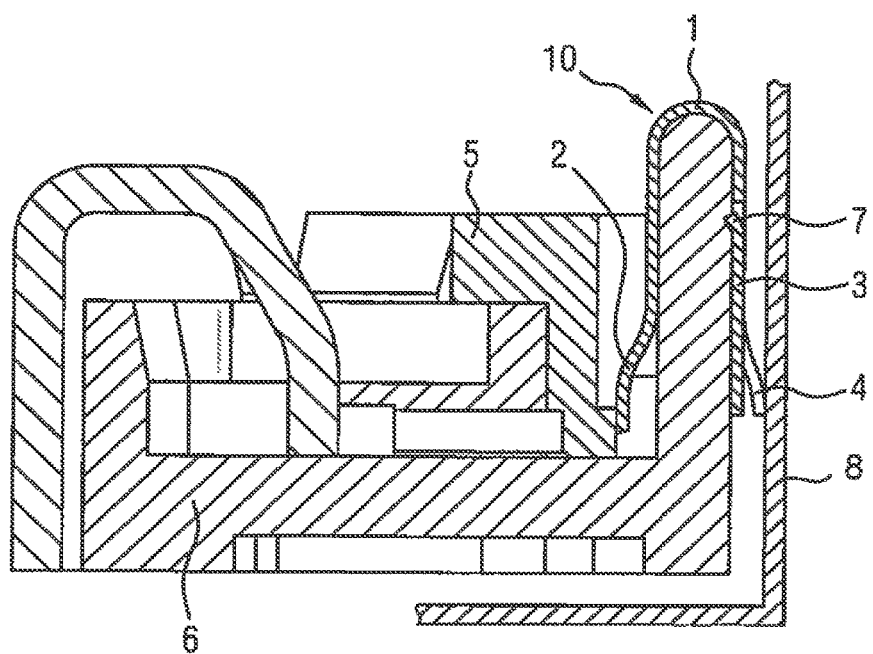
FIG. 4 shows a schematic sectional view of an installed SMD component comprising a contact spring.

FIG. 4 shows a schematic side view of an installed contact spring 10. An SMD component 5 (only schematically depicted) is situated in a recess of a support 6 of an electric motor. The contact spring 10 having, for example, the embodiment depicted in FIG. 3, engages via its U-shaped main section 1 around a part of the support 6 and is clamped thereon, wherein the fixing clamp 7 extends into the corresponding wall. In the installed state, the contact fingers 2 of the contact spring 10 contact the corresponding SMD components 5, while the opposite, resilient contact section 3 on the opposite side of the support 6 extends downward and, via one section 4, electrically contacts the metallic housing wall 8 of the electric motor.

Thus, while there have been shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. An electric motor comprising:
a support (6) having recesses or chambers;
a plurality of SMD components (5) arranged in the recesses or chambers of the support (6);
an electrically conductive housing part;
a connection part connecting the SMD components (5) to the electrically conductive housing part, the connection part being configured as a contact spring (10) clamped on the support (6), and the connection part electrically connecting the plurality of SMD components (5) to the electrically conductive housing part, the contact spring (10) having:
a main section (1),
a resilient connection section, which extends from a first side of the main section (1), for contacting the SMD components (5), and
at least one resilient contact section (3), which extends from a second side of the main section (1), for electrical connection to the electrically conductive housing part,
wherein the resilient connection section of the contact spring (10) comprises a plurality of contact fingers (2) for contacting respective ones of the SMD components (5), which contact fingers (2) engage into the individual recesses or chambers of the support (6) and come into contact with the SMD components (5) arranged in the recesses or chambers, wherein the at least one resilient contact section (3) comprises two legs extending on the second side of the main section (1), the two legs each having a fixing clamp (7), each of which, when the contact spring (10) is located on the support (6), digs into the support (6) to affix the contact spring (10) to the support (6), and wherein each leg of the at least one resilient contact section (3) has divided first and second finger-shaped sections (4), each first finger-shaped portion being contoured so as to contact the electrically conductive housing part, and each second finger-shaped portion being contoured to contact the support (6).

2. The electric motor as claimed in claim 1, wherein the electrically conductive housing part is a housing outer wall (8) of the electric motor.

3. The electric motor as claimed in claim 1, wherein the support (6) is a brush holder of the electric motor.

4. The electric motor as claimed in claim 1, wherein the support (6) consists of an insulating plastic.

5. The electric motor as claimed in claim 1, wherein the SMD components (5) are electrically conductively fixed on the contact fingers (2) by clamping and/or soldering or conductive adhesion.

6. The electric motor as claimed in claim 1, wherein the main section (1) of the contact spring (10) comprises at least one fixing clamp (7) on the side of the contact finger (2) for the SMD components (5) and/or on the side of the at least one contact section (3) for the electrically conductive housing part.

7. The electric motor as claimed in claim 1, wherein an insulating protective wall for avoiding short circuits is arranged between adjacent SMD components (5).

8. A contact spring (10) for connecting a plurality of SMD components (5) arranged on a support (6) of an electric motor to an electrically conductive housing part of the electric motor, the contact spring (10) comprising:

a main section (1);
a resilient connection section extending from a first side of the main section (1); and
at least one resilient contact section (3) extending from a second side of the main section (1),
wherein the resilient connection section of the contact spring (10) comprises a plurality of contact fingers (2) for contacting respective ones of the SMD components (5),
wherein the at least one resilient contact section (3) comprises two legs extending on the second side of the main section (1), the two legs each having a fixing clamp (7), each of which is configured to, when the contact spring (10) is located on the support (6), dig into the support (6) to affix the contact spring (10) to the support (6), and
wherein each leg of the at least one resilient contact section (3) has divided first and second finger-shaped sections (4), each first finger-shaped portion being contoured so as to contact the electrically conductive housing part, and each second finger-shaped portion being contoured to contact the support (6).

9. The contact spring (10) as claimed in claim 8, wherein the main section (1) is U-shaped, the U-shaped main section having a first leg, from which the contact fingers (2) extend.

10. The contact spring (10) as claimed in claim 8, wherein the contact spring (10) is clampable on the support (6) of the electric motor.

* * * * *